(12) United States Patent
Bai et al.

(10) Patent No.: US 8,898,552 B2
(45) Date of Patent: Nov. 25, 2014

(54) COMMUNICATION SYSTEM WITH BLIND DECODING MECHANISM AND METHOD OF OPERATION THEREOF

(71) Applicant: Samsung Electronics Co., Ltd., Gyeonggi-Do (KR)

(72) Inventors: Dongwoon Bai, San Diego, CA (US); Jungwon Lee, San Diego, CA (US); Sungsoo Kim, Seoul (KR); Hanju Kim, Seoul (KR); Inyup Kang, San Diego, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 113 days.

(21) Appl. No.: 13/859,177

(22) Filed: Apr. 9, 2013

(65) Prior Publication Data

US 2013/0283134 A1 Oct. 24, 2013

Related U.S. Application Data

(60) Provisional application No. 61/637,773, filed on Apr. 24, 2012.

(51) Int. Cl.
*H03M 13/03* (2006.01)
*H03M 13/39* (2006.01)
*H03M 13/37* (2006.01)

(52) U.S. Cl.
CPC ...... *H03M 13/3905* (2013.01); *H03M 13/3738* (2013.01)
USPC ............................ 714/794; 714/780; 714/758

(58) Field of Classification Search
CPC ...................... H03M 13/2957; H03M 13/3905
USPC ................................. 714/794, 780, 755, 758
See application file for complete search history.

(56) References Cited

U.S. PATENT DOCUMENTS

| 4,614,933 A * | 9/1986 | Yamashita et al. ............... 341/51 |
| 6,108,372 A | 8/2000 | Tidemann, Jr. et al. |
| 6,654,926 B1 * | 11/2003 | Raphaeli et al. .............. 714/780 |
| 8,249,201 B2 * | 8/2012 | Xu et al. ....................... 375/343 |
| 2007/0177569 A1 | 8/2007 | Lundby |
| 2011/0182385 A1 | 7/2011 | Doan |

FOREIGN PATENT DOCUMENTS

| KR | 10-2013-0091165 A | 8/2013 |
| WO | 2009/074611 A2 | 6/2009 |

* cited by examiner

*Primary Examiner* — Fritz Alphonse
(74) *Attorney, Agent, or Firm* — IP Investment Law Group

(57) ABSTRACT

A communication system includes: a decoding-probability module for calculating a decoding likelihood with a control unit for characterizing an alternative hypothesis regarding an arriving communication; a null-probability module, coupled to the decoding-probability module, for calculating a null likelihood for characterizing a null hypothesis regarding the arriving communication; a weight-calculation module, coupled to the decoding-probability module, for generating a decision weight corresponding to the decoding likelihood, the null likelihood, or a combination thereof; a reliability calculation module, coupled to the decoding-probability module, for calculating a decoding reliability with the decision weight, the decoding likelihood, and the null likelihood, the decoding reliability corresponding to a decoded-result; and a decoding module, coupled to the reliability calculation module, for decoding the arriving communication with a decoding parameter based on the decoding reliability for communicating with a device.

20 Claims, 5 Drawing Sheets

COMMUNICATION SYSTEM WITH BLIND DECODING MECHANISM AND METHOD OF OPERATION THEREOF

CROSS-REFERENCE TO RELATED APPLICATION(S)

This application claims the benefit of U.S. Provisional Patent Application Ser. No. 61/637,773 filed Apr. 24, 2012, and the subject matter thereof is incorporated herein by reference thereto.

TECHNICAL FIELD

The embodiment of the present invention relates generally to a communication system, and more particularly to a communication system with blind decoding mechanism.

BACKGROUND

Modern consumer and industrial electronics, especially devices such as cellular phones, navigations systems, portable digital assistants, and combination devices, are providing increasing levels of functionality to support modern life including mobile communication. Research and development in the existing technologies can take a myriad of different directions.

The increasing demand for information in modern life requires users to access information at any time, at increasing data rates. However, telecommunication signals used in mobile communication effectively experience various types of interferences from numerous sources, as well as computational complexities rising from numerous possible formats for communicated information, which affect the quality and speed of the accessible data.

Thus, a need still remains for a communication system with blind decoding mechanism. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides a communication system, including: a decoding-probability module for calculating a decoding likelihood for characterizing an alternative hypothesis regarding an arriving communication; a null-probability module, coupled to the decoding-probability module, for calculating a null likelihood for characterizing a null hypothesis regarding the arriving communication; a weight calculation module, coupled to the decoding-probability module, for generating a decision weight corresponding to the decoding likelihood, the null likelihood, or a combination thereof; a reliability calculation module, coupled to the decoding-probability module, for calculating a decoding reliability with the decision weight, the decoding likelihood, and the null likelihood, the decoding reliability corresponding to a decoding-result; and a decoding module, coupled to the reliability calculation module, for decoding the arriving communication with a decoding parameter based on the decoding reliability for communicating with a device.

An embodiment of the present invention provides a method of operation of a communication system including: calculating a decoding likelihood for characterizing an alternative hypothesis regarding an arriving communication; calculating a null likelihood for characterizing a null hypothesis regarding the arriving communication; generating a decision weight corresponding to the decoding likelihood, the null likelihood, or a combination thereof; calculating a decoding reliability with the decision weight, the decoding likelihood, and the null likelihood; and decoding the arriving communication with a decoding parameter based on the decoding reliability for communicating with a device.

An embodiment of the present invention provides a method of operation of a communication system including: decoding an arriving communication with a decoding parameter; calculating a decoding likelihood for characterizing an alternative hypothesis for evaluating the arriving communication and the decoding parameter; calculating a null likelihood for characterizing a null hypothesis for evaluating the arriving communication and the decoding parameter; generating a decision weight corresponding to the decoding likelihood, the null likelihood, or a combination thereof; calculating a decoding reliability with the decision weight, the decoding likelihood, and the null likelihood, the decoding reliability corresponding to a decoding-result; and determining a control information from the decoding-result based on the decoding reliability for displaying on a device.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
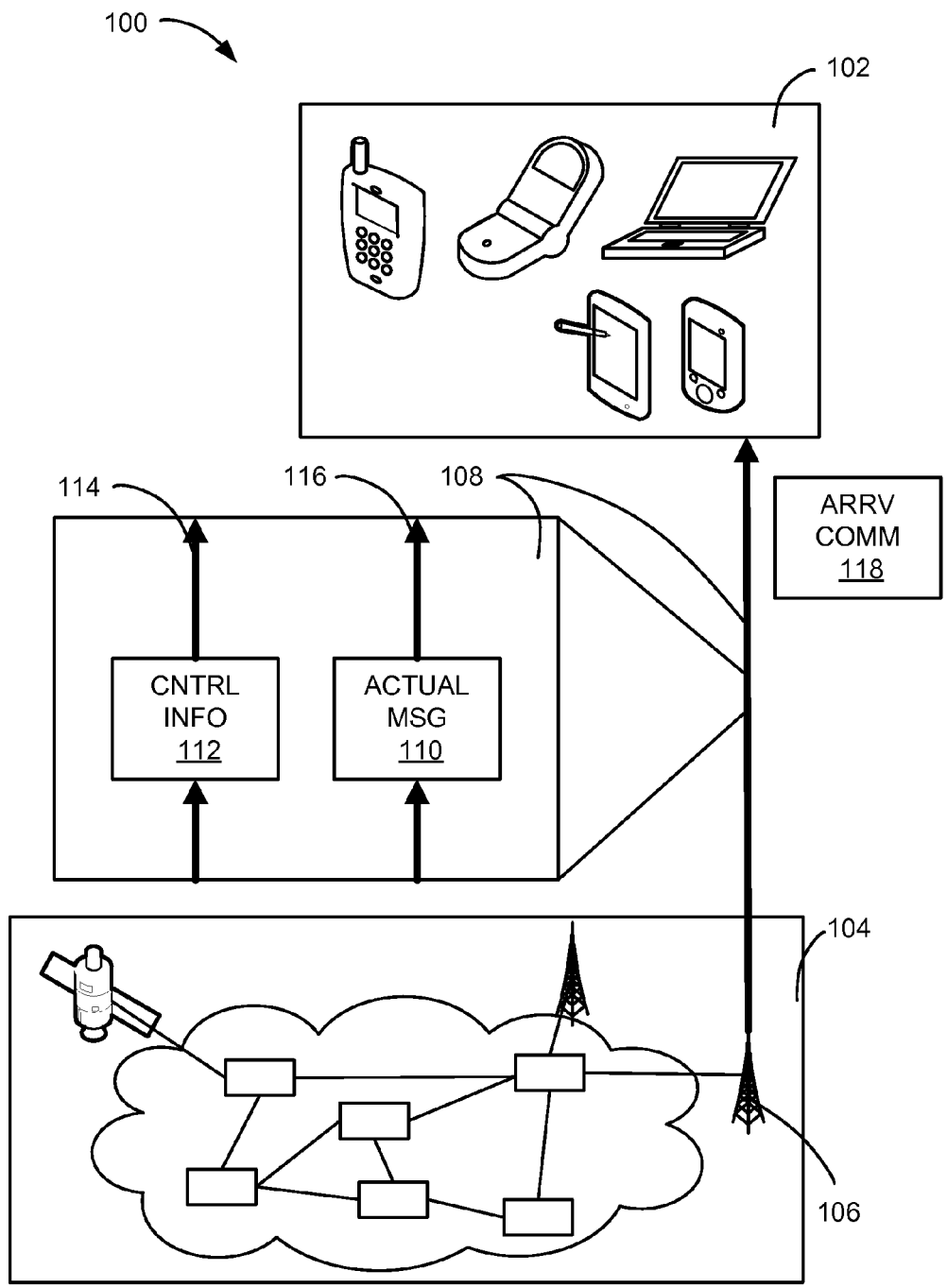
FIG. 1 is a communication system with blind decoding mechanism in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the embodiment of the present invention.

The following embodiments can be used to prune an arriving communication in addition to determining a content error. The arriving communication can be pruned using a decoding reliability, which can be calculated using a decoding likelihood for characterizing an alternative hypothesis, a null likelihood for characterizing a null hypothesis, and a decision weight.

Pruning based on the decoding reliability increases the stability and robustness of the communication system. Further, the decoding likelihood, the null likelihood, and the decision weight can improve accuracy of the communication system without significantly increasing cost or computational complexity.

In the following description, numerous specific details are given to provide a thorough understanding of the invention. However, it will be apparent that the invention may be practiced without these specific details. In order to avoid obscuring the embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation. The embodiments have been numbered first embodiment, second embodiment, etc. as a matter of descriptive convenience and are not intended to have any other significance or provide limitations for embodiment of the present invention.

The term "module" referred to herein can include software, hardware, or a combination thereof in the embodiment of the present invention in accordance with the context in which the term is used. For example, the software can be machine code, firmware, embedded code, and application software. Also for example, the hardware can be circuitry, processor, computer, integrated circuit, integrated circuit cores, a pressure sensor, an inertial sensor, a microelectromechanical system (MEMS), passive devices, or a combination thereof.

The term "processing" as used herein includes filtering signals, decoding symbols, assembling data structures, transferring data structures, manipulating data structures, and reading and writing data structures. Data structures are defined to be information arranged as symbols, packets, blocks, files, input data, system generated data, such as calculated or generated data, and program data.

Referring now to FIG. 1, therein is shown a communication system 100 with blind decoding mechanism in an embodiment of the present invention. The communication system 100 includes a mobile device 102, such as a cellular phone or a notebook computer, connected to a network 104. The network 104 is a system of wired or wireless communication devices that are connected to each other for enabling communication between devices.

For example, the network 104 can include a combination of wires, transmitters, receivers, antennas, towers, stations, repeaters, telephone network, servers, or client devices for a wireless cellular network. The network 104 can also include a combination of routers, cables, computers, servers, and client devices for various sized area networks.

The network 104 can include one or more devices located in a base station 106 for directly or indirectly linking and communicating with the mobile device 102. The base station 106 can receive wireless signals from the mobile device 102, transmit signals to the mobile device 102, process signals, or a combination thereof. The base station 106 can also relay signals between other base stations, components within the network 104, or a combination thereof.

The mobile device 102 can be connected to the network 104 through the base station 106. For example, the base station 106 can include or be with a cell tower, a wireless router, an antenna, a processing device, or a combination thereof being used to send signals to or receive signals from the mobile device 102, such as a smart phone or a laptop computer. The mobile device 102 can connect to and communicate with other devices, such as other mobile devices, servers, computers, telephones, or a combination thereof. The mobile device 102 can further connect to the base station 106 through the network 104.

The base station 106 can be used to wirelessly exchange signals for communication, including voice signals of a telephone call or data representing a website and interactions therewith. The base station 106 can also transmit reference information, training information, error detection information, error correction information, header information, transmission format, protocol information, or a combination thereof.

Based on the communication method, such as code division multiple access (CDMA), orthogonal frequency-division multiple access (OFDMA), Third Generation Partnership Project (3GPP), Long Term Evolution (LTE), or fourth generation (4G) standards, the communication signals can include reference portions, header portions, format portions, error correction or detection portion, or a combination thereof imbedded in the communicated information. The reference portions, header portions, format portions error correction or detection portion, or a combination thereof can include a predetermined bit, pulse, wave, symbol, or a combination thereof. The various portions can be embedded within the communicated signals at regular time intervals, frequency, code, or a combination thereof.

The mobile device 102 can communicate with the base station 106 through a channel 108. The channel 108 is a specific method, parameter, or a combination thereof for communication between devices in two different locations.

The channel 108 can be wireless, wired, or a combination thereof. The channel 108 can be a direct link between the mobile device 102 and the base station 106 or can include repeaters, amplifiers, or a combination thereof. For example, the channel 108 can include communication frequency, time slot, packet designation, transmission rate, channel code, or a combination thereof used for transmitting signals between the mobile device 102 and the base station 106.

The channel 108 can be used to communicate an actual message 110 and control information 112. The actual message 110 is content being transferred from one device to another without unintended errors from error sources from the network 104, the base station 106, the mobile device 102, the channel 108, or a combination thereof. The actual message 110 can be an image, a sound, information, a portion thereof, or a combination thereof for transmitting from the base station 106 to the mobile device 102. The mobile device 102 can further communicate the actual message 110 to the user by displaying or recreating sounds of the actual message 110 on an interfacing portion of the mobile device 102.

For illustrative purposes the communication system 100 will be described as sending information from the base station 106 to the mobile device 102 for downloading information. Although it is understood that the communication system 100 can also have the mobile device 102 send information to the base station 106 for uploading information.

The control information 112 is information representing formats being used to communicate the actual message 110. The control information 112 can have information regarding resource assignments for the mobile device 102. The control information 112 can determine various modes, such as single antenna port, transmit diversity, spatial multiplexing and close-loop rank 1, for receiving communication at the mobile device 102.

The control information 112 can have scheduling information for physical uplink shared channel for various different types of communication protocols and environments. The control information 112 can further be used during random access procedure.

The channel 108 can include a control-channel 114 and a data-channel 116. The data-channel 116 is a collection of resources for communicating content. The data-channel 116 can be a portion of the channel 108, such as frequency, timeslot, code, symbol, or a combination thereof, dedicated to transmitting the actual message 110.

The control-channel 114 is a collection of resources for communicating format information regarding the communication of the content. The control-channel 114 can be a portion of the channel 108, such as frequency, timeslot, code, symbol, or a combination thereof, dedicated to transmitting the control information 112. The control-channel 114 can be separate from the data-channel 116 or share the same frequency or time slot with the data-channel 116. The control-channel 114 can be a physical downlink control channel (PDCCH) for facilitating communication between devices.

The mobile device 102 can receive an arriving communication 118. The arriving communication 118 can include the control information 112, the actual message 110, or a combination thereof. The control-channel 114 can occupy the first one, two, or three symbols in each sub-frame within the arriving communication 118.

The arriving communication 118 can be a set of information transmitted by the base station 106 that has been altered by effects of the channel 108. The arriving communication 118 can be represented as 'y'. The mobile device 102 can receive the arriving communication 118 corresponding to the set of information transmitted by the base station 106. The arriving communication 118 can be different from the set of information transmitted by the base station 106 or the actual message 110.

For example, the channel 108 can affect signals traversing therein by causing a delay, changing a magnitude, changing shape of a pulse, altering a phase, or a combination thereof. The effects of the channel 108 can be caused by transposition from delayed arrival of reflected signals, interference from other transmitted signals, Doppler Effect from movement of the mobile device 102, or a combination thereof. The effects of the channel 108 can be estimated by the communication system 100 and can be represented as 'h'.

The mobile device 102 can decode the arriving communication 118, including the control information 112. The arriving communication 118 can have the control information 112 in various formats, symbols, and locations in frequency and time within the arriving communication 118. The mobile device 102 can decode the control information 112 by determining the format, symbol, location in time or frequency, or a combination thereof corresponding to the control information 112. Details regarding decoding process and the control information 112 will be discussed below.

For illustrative purposes, the communication system 100 will be described as using quadrature phase shift keying (QPSK) modulation for communicating between the base station 106 and the mobile device 102. Although, it is understood that the communication system 100 can use a variety of different modulation schemes, such as quadrature amplitude modulation (QAM) or frequency shift keying (FSK).

Figure 2:
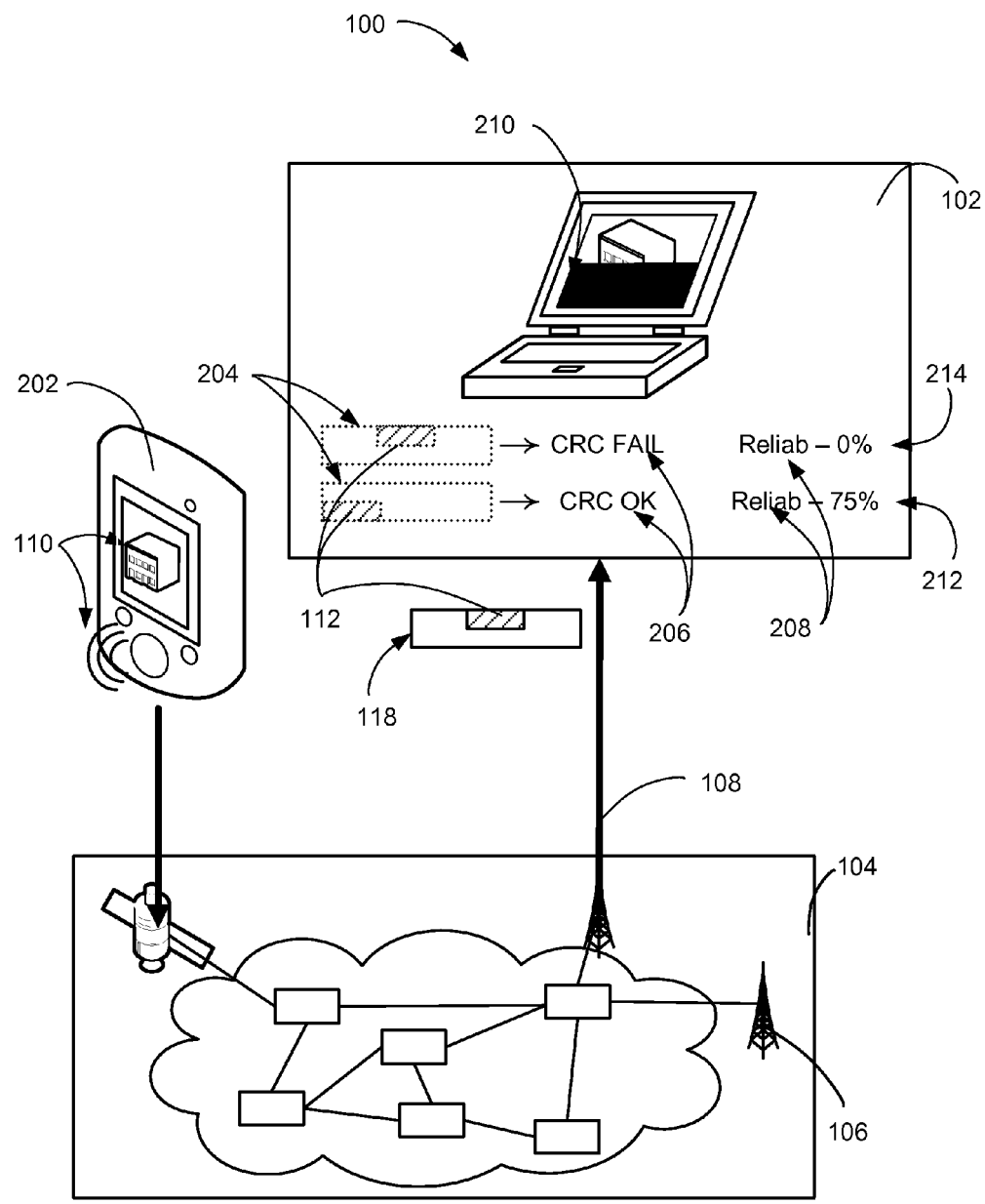
FIG. 2 is an example of communication between the mobile device and the base station.

Referring now to FIG. 2, therein is shown an example of communication between the mobile device 102 and the base station 106. The communication between the mobile device 102 and the base station 106 can be a part of communication between a separate device 202 and the mobile device 102.

For example, the separate device 202 can be a cellular phone communicating voice data, image data, sound data, or a combination thereof for a phone call with the mobile device 102. Also for example, the separate device 202 can be a server or a service provider device communicating sound data, image data, instructions, or a combination thereof for providing a variety of information, such as a web page, a movie, music, software, or a combination thereof.

The separate device 202 and the mobile device 102 can be connected to the network 104 for communication. The mobile device 102 can communicate with the base station 106 in the network 104 through the channel 108.

The separate device 202 can send the actual message 110, such as information for an image, sound, or a combination thereof, to the mobile device 102. The actual message 110 can be adjusted, transformed, combined with other information, or a combination of processes thereof for transmission, which can be received at the mobile device 102 as the arriving communication 118.

The arriving communication 118 can include the control information 112. The control information 112 can be located in a variety of different resources, such as in frequency and timing, using a variety of different formats, such as symbols or content. The communication system 100 can use a decoding parameter 204 to decode the control information 112.

The decoding parameter 204 is information used for processing the arriving communication 118. The decoding parameter 204 can be information, such as for timing, frequency, symbol, bit manipulation, or a combination thereof, used for processing, such as using bits or symbols the control information 112, the arriving communication 118, or a combination thereof.

The decoding parameter 204 can include information associated with format of the control-channel 114 including radio network temporary identifier (RNTI), a length of the control information 112, a location for content transmitted within the control-channel 114, including the control information 112, an aggregation level for the content transmitted within the control-channel 114, or a combination thereof. The decoding parameter 204 can further include information various possible locations, lengths, and contents for various information transmitted through the control-channel 114, including the control information 112.

The communication system 100 can check for a content error 206 for the decoded instance of the control information 112, the arriving communication 118, or a combination thereof. The content error 206 can be a status based on detecting a check sum error, a cyclic redundancy check (CRC) error, or a combination thereof from the sequence of bits produced by decoding the arriving communication 118.

The communication system 100 can further determine a decoding reliability 208. The decoding reliability 208 is an evaluation of the decoding process or a result thereof. The decoding reliability 208 can be a score, a rating, or a probability representing the accuracy of the decoding process or a result thereof. For example, the decoding reliability 208 can represent a likelihood of decoding accuracy, such as a percentage representation or a ratio, that the decoding parameter 204 or the sequence of bits produced by decoding the control information 112, the arriving communication 118, or a combination thereof is correct.

The communication system 100 can have an error result 210. The error result 210 can be a deviation in the output of the mobile device 106 that differs from the actual message 110. The error result 210 can be a dropped call, an alteration in sound, such as in scrambled frequencies or a drop in magnitude, a mistake in depicting an image, such as changes in color or location of a line. The error result 210 can further be associated with slower communication rate, pauses, unintended stops, or a combination thereof in communication, such as when streaming media content through the mobile device 106.

The error result 210 can be from a variety of causes. The error result 210 can be from a signal detection process, system noise, interference from other signals, quality of the channel 108, or a combination thereof.

The error result 210 can include false alarms, miss-results, or a combination thereof from the decoding process. A false alarm can be a situation where the communication system 100 decodes the arriving communication 118 or the control information 112 therein erroneously. The false alarm can be a production of a false positive error where the decoding parameter 204 is incorrect but the content error 206, the decoding reliability 208, or a combination thereof indicates otherwise. The false alarm can be associated with the communication system 100 failing to discard or correct the incorrect instance of the decoding parameter 204.

A miss-result can be a situation where the communication system 100 falsely dismisses an instance of the decoding process or the result thereof. The miss-result can be a production of a false negative error where the decoding parameter 204 is correct but the content error 206, the decoding reliability 208, or a combination thereof indicates otherwise. The miss-result can be associated with the communication system 100 discarding or applying error-processing mechanisms to non-erroneous instances of decoding parameter 204.

The false alarm and the miss-result can result based on processing the content error 206. The communication system 100 can process the arriving communication 118 or the control information 112 and further prune the results based on the decoding reliability 208. The communication system 100 can prune the results by discarding or correcting the arriving communication 118 or the control information 112 based on the decoding reliability 208.

The error result 210 can include a pruning-false-alarm 212, a pruning-miss 214, or a combination thereof. The pruning-false-alarm 212 is a situation where the communication system 100 prunes the arriving communication 118 or the control information 112 therein erroneously.

The pruning-false-alarm 212 can be a situation where the communication system 100 fails to prune the arriving communication 118 or the control information 112 therein erroneously. The pruning-false-alarm 212 can be the false alarm produced by a false positive error where the decoding parameter 204 is incorrect but the content error 206, the decoding reliability 208, or a combination thereof indicates otherwise. The pruning-false alarm 212 can be associated with the communication system 100 failing to prune, by discarding or correcting, the incorrect instance of the decoding parameter 204

The pruning-miss 214 is a situation where the communication system 100 falsely prunes an instance of the decoding process or the result thereof. The pruning-miss 214 can be the miss-result produced by a false negative error where the decoding parameter 204 is correct but the content error 206, the decoding reliability 208, or a combination thereof indicates otherwise. The pruning-miss 214 can be associated with the communication system 100 pruning, by discarding or applying error-processing mechanisms, non-erroneous instances of decoding parameter 204.

It has been discovered that pruning based on the decoding reliability 208 increases the stability and robustness of the communication system 100. The use of decoding reliability 208 to further prune the decoding parameter 204 in addition to error-checking or error-correcting with the content error 206 produces significantly larger reduction in a probability of the pruning-false-alarm 212 compared to a resulting increase in a probability of the pruning-miss 214. Details regarding the pruning process, including calculations and determinations associated with the pruning-false-alarm 212 and the pruning-miss 214 will be discussed below.

Figure 3:
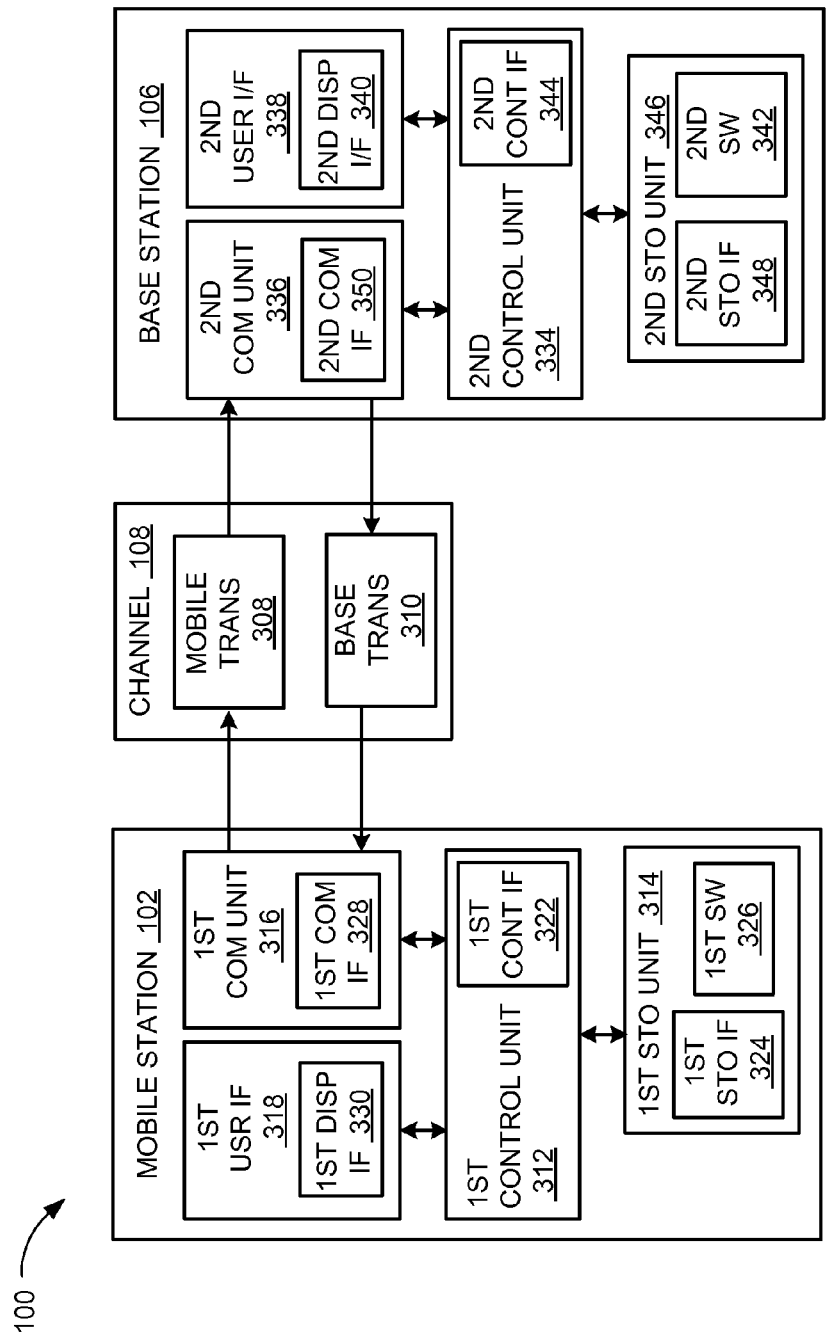
FIG. 3 is an exemplary block diagram of the communication system.

Referring now to FIG. 3, therein is shown an exemplary block diagram of the communication system 100. The communication system 100 can include the mobile device 102, the network 104, and the base station 106. The mobile device 102 can send information in a mobile transmission 308 over the network 104 to the base station 106. The base station 106 can send information in a base transmission 310 over the network 104 to the mobile device 102.

For illustrative purposes, the communication system 100 is shown with the mobile device 102 as a client device, although it is understood that the communication system 100 can have the mobile device 102 as a different type of device. For example, the mobile device 102 can be a server having a display interface.

Also for illustrative purposes, the communication system 100 is shown with the base station 106 as a server, although it is understood that the communication system 100 can have the base station 106 as a different type of device. For example, the base station 106 can be a client device.

For brevity of description in this embodiment of the present invention, the mobile device 102 will be described as a client device and the base station 106 will be described as a server device. The embodiment of the present invention is not limited to this selection for the type of devices. The selection is an example of the embodiment of the present invention.

The mobile device 102 can include a first control unit 312, a first storage unit 314, a first communication unit 316, and a first user interface 318. The first control unit 312 can include a first control interface 322. The first control unit 312 can execute a first software 326 to provide the intelligence of the communication system 100.

The first control unit 312 can be implemented in a number of different manners. For example, the first control unit 312 can be a processor, an application specific integrated circuit (ASIC) an embedded processor, a microprocessor, a hardware control logic, a hardware finite state machine (FSM), a digital signal processor (DSP), or a combination thereof. The first control interface 322 can be used for communication between the first control unit 312 and other functional units in the mobile device 102. The first control interface 322 can also be used for communication that is external to the mobile device 102.

The first control interface 322 can receive information from the other functional units or from external sources, or can transmit information to the other functional units or to external destinations. The external sources and the external destinations refer to sources and destinations external to the mobile device 102.

The first control interface 322 can be implemented in different ways and can include different implementations depending on which functional units or external units are being interfaced with the first control interface 322. For example, the first control interface 322 can be implemented with a pressure sensor, an inertial sensor, a microelectromechanical system (MEMS), optical circuitry, waveguides, wireless circuitry, wireline circuitry, or a combination thereof.

The first storage unit 314 can store the first software 326. The first storage unit 314 can also store the relevant information, such as data representing incoming images, data representing previously presented image, sound files, or a combination thereof.

The first storage unit 314 can be a volatile memory, a nonvolatile memory, an internal memory, an external memory, or a combination thereof. For example, the first storage unit 314 can be a nonvolatile storage such as nonvolatile random access memory (NVRAM), Flash memory, disk storage, or a volatile storage such as static random access memory (SRAM).

The first storage unit 314 can include a first storage interface 324. The first storage interface 324 can be used for communication between and other functional units in the mobile device 102. The first storage interface 324 can also be used for communication that is external to the mobile device 102.

The first storage interface 324 can receive information from the other functional units or from external sources, or can transmit information to the other functional units or to external destinations. The external sources and the external destinations refer to sources and destinations external to the mobile device 102.

The first storage interface 324 can include different implementations depending on which functional units or external units are being interfaced with the first storage unit 314. The first storage interface 324 can be implemented with technologies and techniques similar to the implementation of the first control interface 322.

The first communication unit 316 can enable external communication to and from the mobile device 102. For example, the first communication unit 316 can permit the mobile device 102 to communicate with the base station 106 of FIG. 1, an attachment, such as a peripheral device or a computer desktop, and the network 104.

The first communication unit 316 can also function as a communication hub allowing the mobile device 102 to function as part of the network 104 and not limited to be an end point or terminal unit to the network 104. The first communication unit 316 can include active and passive components, such as microelectronics or an antenna, for interaction with the network 104.

The first communication unit 316 can include a first communication interface 328. The first communication interface 328 can be used for communication between the first communication unit 316 and other functional units in the mobile device 102. The first communication interface 328 can receive information from the other functional units or can transmit information to the other functional units.

The first communication interface 328 can include different implementations depending on which functional units are being interfaced with the first communication unit 316. The first communication interface 328 can be implemented with technologies and techniques similar to the implementation of the first control interface 322.

The first user interface 318 allows a user (not shown) to interface and interact with the mobile device 102. The first user interface 318 can include an input device and an output device. Examples of the input device of the first user interface 318 can include a keypad, a touchpad, soft-keys, a keyboard, a microphone, an infrared sensor for receiving remote signals, or any combination thereof to provide data and communication inputs.

The first user interface 318 can include a first display interface 330. The first display interface 330 can include a display, a projector, a video screen, a speaker, or any combination thereof.

The first control unit 312 can operate the first user interface 318 to display information generated by the communication system 100. The first control unit 312 can also execute the first software 326 for the other functions of the communication system 100. The first control unit 312 can further execute the first software 326 for interaction with the network 104 via the first communication unit 316.

The base station 106 can be optimized for implementing the embodiment of the present invention in a multiple device embodiment with the mobile device 102. The base station 106 can provide the additional or higher performance processing power compared to the mobile device 102. The base station 106 can include a second control unit 334, a second communication unit 336, and a second user interface 338.

The second user interface 338 allows a user (not shown) to interface and interact with the base station 106. The second user interface 338 can include an input device and an output device. Examples of the input device of the second user interface 338 can include a keypad, a touchpad, soft-keys, a keyboard, a microphone, or any combination thereof to provide data and communication inputs. Examples of the output device of the second user interface 338 can include a second display interface 340. The second display interface 340 can include a display, a projector, a video screen, a speaker, or any combination thereof.

The second control unit 334 can execute a second software 342 to provide the intelligence of the base station 106 of the communication system 100. The second software 342 can operate in conjunction with the first software 326. The second control unit 334 can provide additional performance compared to the first control unit 312.

The second control unit 334 can operate the second user interface 338 to display information. The second control unit 334 can also execute the second software 342 for the other functions of the communication system 100, including operating the second communication unit 336 to communicate with the mobile device 102 over the network 104.

The second control unit 334 can be implemented in a number of different manners. For example, the second control unit 334 can be a processor, an embedded processor, a microprocessor, hardware control logic, a hardware finite state machine (FSM), a digital signal processor (DSP), or a combination thereof.

The second control unit 334 can include a second controller interface 344. The second controller interface 344 can be used for communication between the second control unit 334 and other functional units in the base station 106. The second controller interface 344 can also be used for communication that is external to the base station 106.

The second controller interface 344 can receive information from the other functional units or from external sources, or can transmit information to the other functional units or to external destinations. The external sources and the external destinations refer to sources and destinations external to the base station 106.

The second controller interface 344 can be implemented in different ways and can include different implementations depending on which functional units or external units are being interfaced with the second controller interface 344. For example, the second controller interface 344 can be implemented with a pressure sensor, an inertial sensor, a microelectromechanical system (MEMS), optical circuitry, waveguides, wireless circuitry, wireline circuitry, or a combination thereof.

A second storage unit 346 can store the second software 342. The second storage unit 346 can also store the such as data representing incoming images, data representing previously presented image, sound files, or a combination thereof. The second storage unit 346 can be sized to provide the additional storage capacity to supplement the first storage unit 314.

For illustrative purposes, the second storage unit 346 is shown as a single element, although it is understood that the second storage unit 346 can be a distribution of storage elements. Also for illustrative purposes, the communication system 100 is shown with the second storage unit 346 as a single hierarchy storage system, although it is understood that the communication system 100 can have the second storage unit 346 in a different configuration. For example, the second storage unit 346 can be formed with different storage technologies forming a memory hierarchal system including different levels of caching, main memory, rotating media, or off-line storage.

The second storage unit 346 can be a volatile memory, a nonvolatile memory, an internal memory, an external memory, or a combination thereof. For example, the second storage unit 346 can be a nonvolatile storage such as non-volatile random access memory (NVRAM), Flash memory, disk storage, or a volatile storage such as static random access memory (SRAM).

The second storage unit 346 can include a second storage interface 348. The second storage interface 348 can be used for communication between other functional units in the base station 106. The second storage interface 348 can also be used for communication that is external to the base station 106.

The second storage interface 348 can receive information from the other functional units or from external sources, or can transmit information to the other functional units or to external destinations. The external sources and the external destinations refer to sources and destinations external to the base station 106.

The second storage interface 348 can include different implementations depending on which functional units or external units are being interfaced with the second storage unit 346. The second storage interface 348 can be implemented with technologies and techniques similar to the implementation of the second controller interface 344.

The second communication unit 336 can enable external communication to and from the base station 106. For example, the second communication unit 336 can permit the base station 106 to communicate with the mobile device 102 over the network 104.

The second communication unit 336 can also function as a communication hub allowing the base station 106 to function as part of the network 104 and not limited to be an end point or terminal unit to the network 104. The second communication unit 336 can include active and passive components, such as microelectronics or an antenna, for interaction with the network 104.

The second communication unit 336 can include a second communication interface 350. The second communication interface 350 can be used for communication between the second communication unit 336 and other functional units in the base station 106. The second communication interface 350 can receive information from the other functional units or can transmit information to the other functional units.

The second communication interface 350 can include different implementations depending on which functional units are being interfaced with the second communication unit 336. The second communication interface 350 can be implemented with technologies and techniques similar to the implementation of the second controller interface 344.

The first communication unit 316 can couple with the network 104 to send information to the base station 106 in the mobile transmission 308. The base station 106 can receive information in the second communication unit 336 from the mobile transmission 308 of the network 104.

The second communication unit 336 can couple with the network 104 to send information to the mobile device 102 in the base transmission 310. The mobile device 102 can receive information in the first communication unit 316 from the base transmission 310 of the network 104. The communication system 100 can be executed by the first control unit 312, the second control unit 334, or a combination thereof. For illustrative purposes, the base station 106 is shown with the partition having the second user interface 338, the second storage unit 346, the second control unit 334, and the second communication unit 336, although it is understood that the base station 106 can have a different partition. For example, the second software 342 can be partitioned differently such that some or all of its function can be in the second control unit 334 and the second communication unit 336. Also, the base station 106 can include other functional units not shown in FIG. 3 for clarity.

The functional units in the mobile device 102 can work individually and independently of the other functional units. The mobile device 102 can work individually and independently from the base station 106 and the network 104.

The functional units in the base station 106 can work individually and independently of the other functional units. The base station 106 can work individually and independently from the mobile device 102 and the network 104.

For illustrative purposes, the communication system 100 is described by operation of the mobile device 102 and the base station 106. It is understood that the mobile device 102 and the base station 106 can operate any of the modules and functions of the communication system 100.

Figure 4:
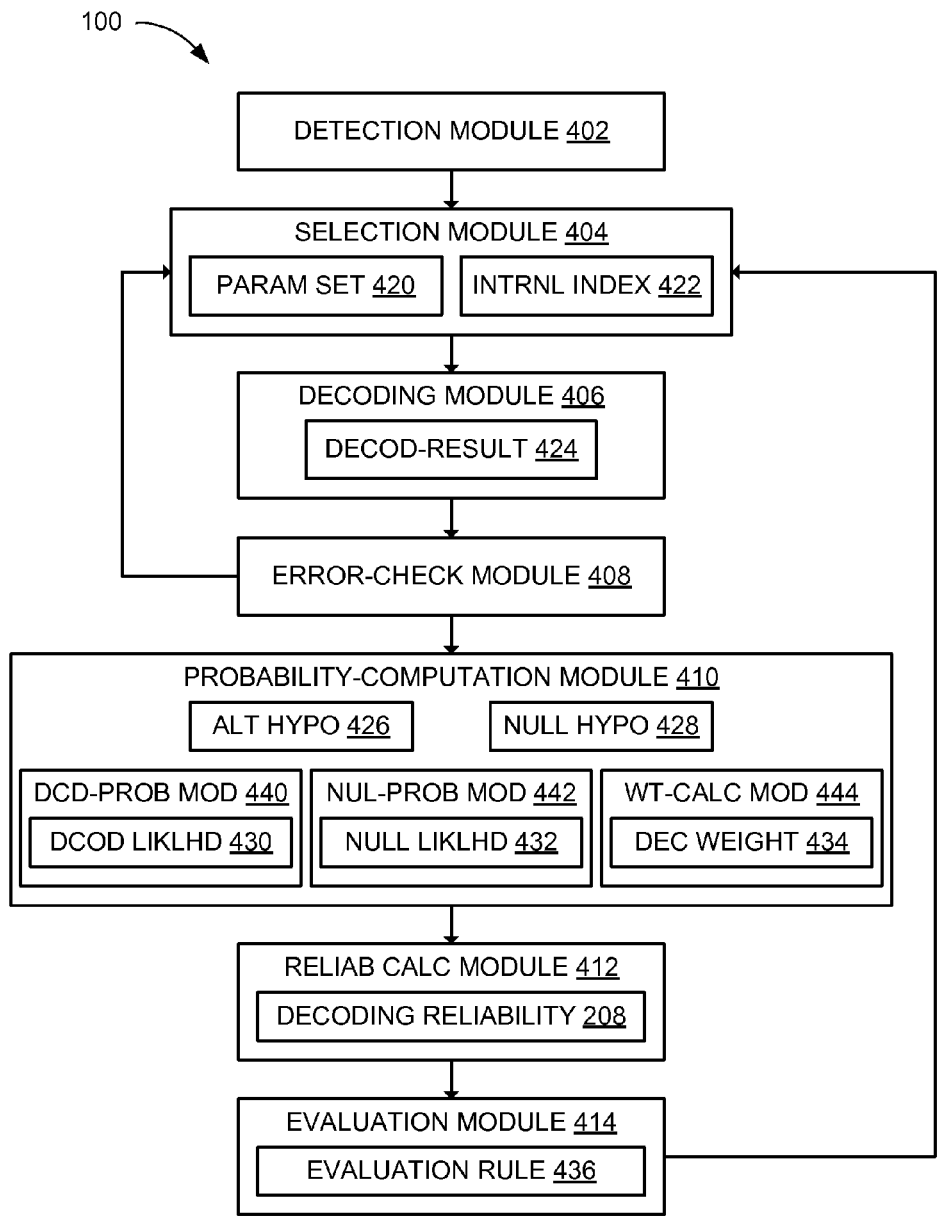
FIG. 4 is a control flow of the communication system.

Referring now to FIG. 4, therein is shown a control flow of the communication system 100. The communication system 100 can have a detection module 402, a selection module 404, a decoding module 406, an error-check module 408, a probability-computation module 410, a reliability calculation module 412, and an evaluation module 414.

The detection module 402 can be coupled to the selection module 404, which can be further coupled to the decoding module 406. For example, one or more outputs of the detection module 402 can be connected to one or more inputs of the selection module 404, one or more outputs of the selection module 404 can be connected to one or more inputs of the decoding module 406, or a combination thereof.

Similarly, the decoding module 406 can be coupled to the error-check module 408, which can be further coupled to the probability-computation module 410. Likewise, the probability-computation module 410 can be further coupled to the reliability calculation module 412. The reliability calculation module 412 can be coupled to the evaluation module 414 and the evaluation module 414 can be further coupled to the selection module in similar manner as described above.

The detection module 402 is for receiving the arriving communication 118 of FIG. 1. The detection module 402 can use the first communication unit 316 of FIG. 3, the second communication 336 of FIG. 3, the first control unit 312 of FIG. 3, the second control unit 334 of FIG. 3, or a combination thereof to receive the arriving communication 118.

The detection module 402 can receive the arriving communication 118 and identify symbols transmitted over the channel 108 of FIG. 1. The detection module 402 can identify the transmitted symbols from the base station 106 of FIG. 1 by identifying patterns of magnitude, frequency, phase, or a combination thereof for electromagnetic signals.

The detection module 402 can further identify the transmitted symbols by identifying and compensating for degradations in the transmitted symbols due to properties of the channel 108. The detection module 402 can identify and compensate for the degradations using reference communications, such as pilot tone or reference signal, transmitted by the base station 106. The detection module 402 can have a predetermined frequency, phase, content, shape, power level, or a combination thereof set by the communication standard, the communication system 100, or a combination thereof.

The detection module 402 can identify one or more portions within the arriving communication 118 corresponding to the reference communication. The detection module 402 can identify the changes in magnitude, phase, frequency, content, power level, or a combination thereof in one or more portions within the arriving communication 118 corresponding to the reference communication to identify effects of the channel 108.

The detection module 402 can further identify the effects of the channel 108 using mathematical models including shifting, using mathematical operations, or a combination thereof. The detection module 402 can further use frequency or time domain transformation, convolution, transposition, or a combination thereof with the predetermined or received instances of the reference communication, or with both. The detection module 402 can also use methods such as the least square method, the least mean square (LMS) method, or the minimum mean square error (MMSE) method.

The detection module 402 can transform the received and processed symbol information into symbols, bit information, or a combination thereof. The arriving communication 118 can be a sequence of symbols, bits, or a combination thereof after processing by the detection module 402. The detection module 402 can store the arriving communication 118 in the first storage unit 314 of FIG. 3, the second storage unit 346 of FIG. 3, or a combination thereof.

After receiving the arriving communication 118, the control flow can pass to the selection module 404. The control flow can pass by having the arriving communication 118 pass from the detection module 402 as an input to the selection module 404, by storing the arriving communication 118 at a location known and accessible to the selection module 404, by notifying the selection module 404, such as by using a flag, an interrupt, a status signal, or a combination, or a combination of processes thereof.

The selection module 404 is for selecting the decoding parameter 204 of FIG. 2. The selection module 404 can have a parameter set 420 for the decoding parameter 204 stored in the first storage unit 314, the second storage unit 346, or a combination thereof as determined by the communication standard, the computing system 100, or a combination thereof.

For example, the possible location of the control-channel 114 of FIG. 1, such as frequency, time slot, or a combination thereof can be predetermined and known as a search space. The search space can further be different, such as in length or content, based on the control information 112 of FIG. 1. The parameter set 420 can have up to 22 pairs of locations, as an example, and possible contents of the control information 112, up to 44 different parameter instances, as an example, using a combination of possible locations, possible content or length of the control information 112, or a combination thereof.

The selection module 404 can select the decoding parameter 204 by assigning one or more values corresponding to one instance from the parameter set 420 as the decoding parameter 204. The selection module 404 can have an internal index 422 for tracking the instance of the parameter set 420 assigned to the decoding parameter 204.

The selection module 404 can start from the first instance of the parameter set 420, such as having an index value of 0 or 1. The selection module 404 can set the value of the internal index 422 as the value of the index value or the ordinal value corresponding to the instance of the parameter set 420 used as the decoding parameter 204.

The selection module 404 can use the first control interface 322 of FIG. 3, the first storage interface 324 of FIG. 3, the second control interface 344 of FIG. 3, the second storage interface 348 of FIG. 3, for a combination thereof to access the parameter set 420 and to select the decoding parameter 204. The selection module 404 can store the internal index 422, the decoding parameter 204, the arriving communication 118, or a combination thereof in the first storage unit 314, the second storage unit 346, or a combination thereof.

The control flow can pass from the selection module 404 to the decoding module 406 after the selection of the decoding parameter 204. The control flow can pass using the internal index 422, the decoding parameter 204, the arriving communication 118, a status signal or a combination thereof as described above between the detection module 402 and the selection module 404.

The decoding module 406 is for decoding the arriving communication 118 using the decoding parameter 204. The decoding module 406 can produce a decoded-result 424 from decoding the arriving communication 118 using the decoding parameter 204.

The decoding module 406 can use the format, location, length, content, pattern, or a combination of information thereof specified by the decoding parameter 204. The decoding module 406 can decode the arriving communication 118 by changing symbol information to bits, rearranging bit information according to specified formats, or a combination thereof. The decoded-result 424 can be the sequence of bits produced from decoding the arriving communication 118.

The decoding module 406 can use the first control unit 312, the first communication unit 316, the second control unit 334, the second communication unit 336, or a combination thereof to decode the arriving communication 118 into the decoded-result 424. The decoding module 406 can store the decoded-result 424 in the first storage unit 314, the second storage unit 346, or a combination thereof.

The control flow can pass from the decoding module 406 to the error-check module 408 using the decoded-result 424, a status indicator, or a combination thereof as described above between the detection module 402 and the selection module 404. The error-check module 408 is for checking for validity of decoded result.

The error-check module 408 can check for the validity by determining the content error 206 of FIG. 2 based on decoding the arriving communication 118 with the decoding parameter 204. For example, the error-check module 408 can determine the content error 206 as a status of performing a cyclical redundancy check (CRC) or a check sum process using the decoded-result 424.

The error-check module 408 can assign a Boolean value, a number, a symbol, a text value, or a combination thereof to the content error 206 as a result of the validity check. For example, the error-check module 408 can assign True or False, a zero value or a non-zero value, "pass" or "fail", or a combination thereof to the content error 206 when the decoded-result 424 passes or fails the validity check.

The error-check module 408 can increment the internal index 422 when the content error 206 indicates failure of the validity check. The control flow can pass from the error-check module 408 to the selection module 404 using the internal index 422, a status indicator, or a combination thereof similarly as described above between the detection module 402 and the selection module 404.

The selection module 404 can select the next occurring instance of the parameter set 420 as the decoding parameter 204 according to the internal index 422. The decoding module 406 can decode the arriving communication 118 using the decoding parameter 204 to produce a new instance of the decoded-result 424.

The control flow can pass from the error-check module 408 to the probability-computation module 410 without incrementing the internal index 422 when the content error 206 indicates the decoded-result 424 passing the validity check. The control flow can pass from the error-check module 408 to the probability-computation module 410 using the internal index 422, the decoded-result 424, the content error 206, the decoding parameter 204, a status indicator, or a combination thereof similarly as described above between the detection module 402 and the selection module 404.

The probability-computation module 410 is for evaluating an accuracy of the decoding process using probabilities. The probability-computation module 410 can calculate the probability that the decoding parameter 204 for decoding the arriving communication 118 is appropriate, is inappropriate, or a combination of the probabilities thereof.

The probability-computation module 410 can have an alternative hypothesis 426 and a null hypothesis 428 for characterizing a relationship between the arriving communication 118 and the decoding parameter 204. The alternative hypothesis 426 and the null hypothesis 428 can be for evaluating an accuracy of using the decoding parameter 204 to decode the arriving communication 118.

The alternative hypothesis 426 is an expression or presumption that the arriving communication 118 includes information intended to be decoded following the decoding formats for the control-channel 114. The alternative hypothesis 426 can be a mathematical expression, a numerical expression, or a combination thereof. The alternative hypothesis 426 can be an expression or presumption that can be evaluated by the communication system 100.

The null hypothesis 428 is an expression or presumption that the arriving communication 118 includes information not intended to be decoded following decoding formats for the control-channel 114. The null hypothesis 428 can be a mathematical expression, a numerical expression, or a combination thereof. The null hypothesis 428 can be an expression or presumption that can be evaluated by the communication system 100. The null hypothesis 428 can represent situation when symbols in the arriving communication 118 or the contents received through the control-channel 114 is modeled as a random signal or a blank signal.

The probability-computation module 410 can have a decoding-probability module 440, a null-probability module 442, and a weight-calculation module 444 for evaluating the hypotheses. The decoding-probability module 440 is for evaluating the alternative hypothesis 426. The decoding-probability module 440 can evaluate the alternative hypothesis 426 by calculating a decoding likelihood 430.

The decoding likelihood 430 is a statistical likelihood that the decoding process was appropriate. The decoding likelihood 430 can characterize the accuracy of the alternative hypothesis 426. The decoding likelihood 430 can characterize the accuracy by representing the probability that the decoding parameter 204 was appropriate for decoding the arriving communication 118, that the decoded-result 424 is accurately associated with the actual message 110 of FIG. 1, or a combination thereof.

The decoding-probability module 440 can calculate the decoding likelihood 430 by calculating a likelihood of a portion of the arriving communication 118, the decoded result 424, or a combination thereof given various possible symbols that could have been sent through the control-channel 114. The arriving communication 118, having therein signals affected by noise, interference, inherent channel qualities, or a combination thereof, can be represented as:

$$\vec{y} = (y_0, y_1, \ldots, y_{N/2-1}).$$ Equation (1).

The arriving communication 118 can be received by the detection module 402. The received instance of the arriving communication 118 can be further represented as:

$$y_n = h_n x_n + z_n.$$ Equation (2).

Effects of the channel 108 can be represented by $h_n$, $x_n$ can represent n-th element of transmitted code word and noise can be represented by $z_n$. The decoding likelihood 430 can be approximated as:

$$p(\vec{y} \mid H_{PDCCH}) \approx p(\vec{y} \mid \vec{\hat{x}}_1) \frac{1}{2^{K-L}}.$$ Equation (3).

The decoding likelihood 430 can approximate a likelihood of the decoded result 424 given the alternative hypothesis 426, expressed as $H_{PDCCH}$, for characterizing the alternative hypothesis 426 for PDCCH.

For Equation (3), K can be the length of the control information 112, L can be the amount of information in the arriving communication 118 for determining the content error 206, such as the number of CRC or check sum bits, $\vec{\hat{x}}_1$ can represent the decoded result 424 passing the error-check module 408 and where $\vec{\hat{x}}_1, \ldots, \vec{\hat{x}}_{2^{K-L}}$ are all possible tail biting convolutional codes used for transmitting information using the control-channel 114 with the following decreasing order of likelihood, such as:

$$p(\vec{y} \mid \vec{\hat{x}}_1) \geq \ldots \geq p(\vec{y} \mid \vec{\hat{x}}_{2^{K-L}}).$$ Equation (4).

The decoding-probability module 440 can have a Viterbi decoder therein, which can determine the most likely code word $\vec{\hat{x}}_1$.

The decoding likelihood 430 can be further expressed as:

$$\frac{1}{2^{K-L}} p(\vec{y} \mid \vec{\hat{x}}_1) = \frac{1}{2^{K-L}} \prod_{n=0}^{\frac{N}{2}-1} \frac{1}{\pi \sigma^2} \exp\left(-\frac{1}{\sigma^2} |y_n - h_n \hat{x}_{1,n}|^2\right).$$ Equation (5).

For Equation (5), a most likely instance of the code word can be expressed as $\vec{\hat{x}}_1$, where:

$$\vec{\hat{x}}_1 = (\hat{x}_{1,0}, \hat{x}_{1,1}, \ldots, \hat{x}_{1,N/2-1}).$$ Equation (6).

Variance of the noise can be expressed as $\sigma^2$, and $y_n$ can represent the arriving communication 118.

The decoding likelihood 430 can also be a log-likelihood. The decoding likelihood 430 as the log-likelihood can be expressed as:

$$\ln p(\vec{y} \mid H_{PDCCH}) \approx$$ Equation (7)

$$-\sum_{n=0}^{\frac{N}{2}-1} \frac{1}{\sigma^2} |y_n - h_n \hat{x}_{1,n}|^2 - (K-L)\ln 2 - \frac{N}{2} \ln \pi \sigma^2 =$$

-continued $$-\sum_{n=0}^{\frac{N}{2}-1} \frac{1}{\sigma^2} |y_n|^2 - 2\text{Re}(h_n^* y_n \hat{x}_{1,n}^*) +$$

$$|h_n|^2 - (K-L)\ln 2 - \frac{N}{2}\ln \pi \sigma^2.$$

The term $|y_n - h_n \hat{x}_{1,n}|^2$ can be the squared Euclidean distance between the receiver signal and the most likely code word. Since all other terms are common terms included in the null likelihood 440 which do not need to be computed, the decoding likelihood 430 can be represented by $$\ln p(\vec{y} \mid H_{PDCCH}) + \sum_{n=0}^{\frac{N}{2}-1} \frac{1}{\sigma^2}(|y_n|^2 + |h_n|^2) + \frac{N}{2}\ln \pi \sigma^2 \approx$$

$$-\sum_{n=0}^{\frac{N}{2}-1} \frac{2}{\sigma^2}\text{Re}(h_n^* y_n \hat{x}_{1,n}^*) - (K-L)\ln 2.$$

Equation (8).

Thus, the decoding-probability module 440 can calculate the decoding likelihood 430 by approximating as in Equation (3) using a Viterbi decoder, sign flipping, additions, or a combination thereof. Although the decoding-probability module 440 can calculate the decoding likelihood 430 by calculating the squared Euclidean distance between the arriving communication 118 and the most likely code word distorted by the fading, such computation of the squared Euclidean distance may not be needed.

For example, referencing Equation (8), $\hat{x}_{1,n}$ can be obtained from the output of the Viterbi decoder, $h_n^* y_n$ can be the input of the Viterbi decoder, which can be stored to eliminate additional computation. Their product, $h_n^* y_n \hat{x}_{1,n}^*$, can be implemented by sign flipping.

Moreover, $$\sum_{n=0}^{\frac{N}{2}-1} \text{Re}(h_n^* y_n \hat{x}_{1,n}^*)$$

can represent the real part of the average correlation between $h_n^* y_n$ and $\hat{x}_{1,n}$. The decoding-probability module 440 can calculate the decoding likelihood 430 without using additional complicated operations including multiplication, division, transformation, derivative, integral, or a combination thereof.

The decoding-probability module 440 can calculate the decoding likelihood 430 based on the content error 206 indicating that the decoded-result 424 satisfied the validity check. The decoding-probability module 440 can be required to determine the decoding likelihood 430 only if the control flow passes from the error-check module 408 to the probability-computation module 410 and not to the selection module 404. The decoding-probability module 440 can also be required to check for the content error 206 and determine the decoding likelihood 430 if the value of the content error 206 indicates that the decoded-result 424 satisfied the validity check.

It has been discovered that the calculation of the decoding likelihood 430 based on the content error 206 can provide increased accuracy and robustness for the communication system 100. The decoding likelihood 430 based on the content error 206 can provide increased accuracy and robustness by identifying and not processing cases where the decoding results do not pass an error check.

The decoding likelihood 430 can be associated with the probability of the pruning-miss 214 of FIG. 2, the pruning-false-alarm 212 of FIG. 2, or a combination thereof. The decoding likelihood 430 can be used to quantify the likelihood that the decoding parameter 204 is correct but will be dismissed by the evaluation module 414, as will be discussed below. The probability of the pruning-miss 214 can be expressed as:

$$P_{MS} \triangleq \int_{\vec{y} \in R_{Null}} p(\vec{y} \mid H_{PDCCH}) d\vec{y}.$$

Equation (9).

For Equation (9), $R_{Null}$ can represent a region of pruning where $\vec{y}$ can be dismissed by the evaluation module 414, as will be discussed below. The probability of the pruning-miss 214 can be an integral of Equation (3) assuming that $\vec{y}$ comes from a valid code word related to the alternative hypothesis 426.

It has been discovered that the decoding likelihood 430 provides improved accuracy for the communication system 100. The decoding likelihood 430 provides improved accuracy by providing an additional measure of accuracy for the decoding process beyond the content error 206. The added level of independent evaluation for the decoding process improves the overall accuracy for the processed signals.

It has also been discovered that the decoding likelihood 430 calculated with slicing, sign flipping, correlation computation, and additions provides improved efficiency and robustness for the communication system 100. The decoding likelihood 430 provides improved accuracy and robustness by having a probability basis requiring only simple calculations instead of a correlation basis with more complex operations as described above.

The null-probability module 442 is for evaluating the null hypothesis 428. The null-probability module 442 can be connected to the decoding-probability module 440 or separate from the decoding-probability module 440. For example, the null-probability module 442 can be connected to the decoding-probability module 440 with wires, input-output combination, in shared memory, or a combination thereof. Also for example, the null-probability module 442 can process information parallel to the decoding-probability module 440 using separate processors or cores in the first control unit 312, the second control unit 334, or a combination thereof.

The null-probability module 442 can evaluate the null hypothesis 428 by calculating a null likelihood 432. The null likelihood 432 is a probability that the content of the control-channel 114 was random.

The null likelihood 432 can characterize the probability that the decoding process was not appropriate. The null likelihood 432 can also characterize the accuracy of the null hypothesis 428. The null likelihood 432 can characterize the accuracy by represent the probability that the decoding parameter 204 was not appropriate for decoding the arriving communication 118, that the content received over the control-channel 114 can be modeled as being blank, filled with random QPSK signal, or filled with pseudo control information, or combination of representations thereof.

The null-probability module 442 can calculate the null likelihood 432 by calculating a likelihood of a portion of the arriving communication, the decoded result 424, or a combination thereof given the null hypothesis 428, where the portion of the arriving communication, the decoded result 424, or a combination thereof is part of various possible symbols that could have been sent through the control-channel 114.

The null likelihood 432 can be expressed as:

$$p(\vec{y}|H_{Null}) = \Pi_{i=0}^{M_A-1}(p(\vec{y_l}|H_{Null},\text{Blank})P_B + p(\vec{y_l}|H_{Null},QPSK)P_Q). \quad \text{Equation (10).}$$

For the null likelihood 432, $\vec{y}$ can represent the decoded result 424, $H_{Null}$ can represent the null hypothesis 428. The notation $P_B$ can be the probability of Blank given the null hypothesis 428 and the notation $P_Q$ can be the probability of QPSK given the null hypothesis 428. A sum of the probability of Blank and the probability of QPSK given the null hypothesis 428 can be 1. An aggregation level of the control-channel 114 of $\vec{y}$ can be denoted as $M_A \in \{1, 2, 4, 8\}$.

The null likelihood 432 can also be a log-likelihood. The null likelihood 432 as the log-likelihood can be expressed as:

$$\ln p(\vec{y}|H_{Null}) = \sum_{i=0}^{M_A-1} \ln(p(\vec{y_l}|H_{Null},\text{Blank})P_B + p(\vec{y_l}|H_{Null},QPSK)P_Q) \quad \text{Equation (11).}$$

$$= \sum_{i=0}^{M_A-1} \ln[\exp(\ln p(\vec{y_l}|H_{Null},\text{Blank}) + \ln P_B) + \exp(\ln p(\vec{y_l}|H_{Null},QPSK) + \ln P_Q)]$$

The null likelihood 432 can be computed as a log-likelihood of $\vec{y}$, the arriving communication 118 given the null hypothesis 428.

For Equation (11), $$\ln p(\vec{y_l}|H_{Null},\text{Blank}) = -\sum_{n=M_C i}^{M_C i+M_C-1}\left(\frac{1}{\sigma^2}|y_n|^2 + \ln\pi\sigma^2\right). \quad \text{Equation (12).}$$

Along with the representations described above, $M_C$ can denote the length of $\vec{y_l}$ received over the control-channel 114 in complex symbols. For example, $N/2 = M_A M_C$, $\vec{y} = (\vec{y_0}, \ldots, \vec{y_{M_A-1}})$.

$$\ln p(\vec{y_l}|H_{Null},QPSK) = \quad \text{Equation (13).}$$

$$-\sum_{n=M_C i}^{M_C i+M_C-1}\left[\ln\sum_{s \in C}\exp\left(-\frac{1}{\sigma^2}|y_n - h_n s|^2\right) - \ln\pi\sigma^2\right] - 2M_C \ln 2$$

The notation C can represent the set of QPSK constellations, such as $$\left\{\frac{1}{\sqrt{2}}(1+j), \frac{1}{\sqrt{2}}(1-j), \frac{1}{\sqrt{2}}(-1+j), \frac{1}{\sqrt{2}}(-1-j)\right\}.$$

The null likelihood 432 as an approximation can further be expressed as:

$$\ln p(\vec{y}|H_{Null}) \approx \sum_{i=0}^{M_A-1} \max\{\ln p(\vec{y_l}|H_{Null},\text{Blank}) + \ln P_B, \quad \text{Equation (14).}$$

$$\ln p(\vec{y_l}|H_{Null},QPSK) + \ln P_Q\} \approx \frac{N}{2}\ln\pi\sigma^2 +$$

$$\sum_{i=0}^{M_A-1} \max\left\{-\sum_{n=M_C i}^{M_C i+M_C-1} \frac{1}{\sigma^2}|y_n|^2 + \ln P_B, A_i + \ln P_Q\right\}.$$

The notation $A_i$ can be:

$$A_i \triangleq \ln p(\vec{y_l}|H_{Null},QPSK) + M_C \ln\pi\sigma^2 = \quad \text{Equation (15).}$$

$$\sum_{n=M_C i}^{M_C i+M_C-1} \ln\sum_{s \in C} \frac{1}{4}\exp\left(-\frac{1}{\sigma^2}|y_n - h_n s|^2\right).$$

The notation $A_i$ can be further approximated for the null likelihood 432 as:

$$\hat{A}_i \triangleq -\sum_{n=M_C i}^{M_C i+M_C-1} \frac{1}{\sigma^2}|y_n - h_n s_{min}|^2 - \quad \text{Equation (16).}$$

$$2M_C \ln 2 + \sum_{n=M_C i}^{M_C i+M_C-1} B\left(C, \frac{\sigma}{|h_n|}\right).$$

Along with the above described representations, $s_{min}$ can be the minimum distance constellation point defined as:

$$s_{min}(y_n/h_n) \triangleq \text{argmin}_{s \in C}|y_n - h_n s|. \quad \text{Equation (17).}$$

Moreover, B can be a derivation of:

$$B(C, \sigma) = \quad \text{Equation (18).}$$

$$E_{y_n/h_n}\left[\ln\left(1 + \frac{\sum_{s_i \in C/\{s_{min}(y_n/h_n)\}} \exp\left(-\frac{1}{\sigma^2}|y_n/h_n - s_i|^2\right)}{\exp\left(-\frac{1}{\sigma^2}|y_n/h_n - s_{min}|^2\right)}\right)\right].$$

The null-probability module 442 can implement Equation (18) using a look-up table which can be pre-computed offline by the communication system 100. Equation (11) or Equation (14) can be used for the null likelihood 432 when the communication system 100 utilizes Equation (7) for the decoding likelihood 430.

For utilizing Equation (8) to represent the decoding likelihood 430, the null likelihood 432 as a log-likelihood can also be represented by:

$$\ln p(\vec{y} \mid H_{Null}) + \sum_{n=0}^{\frac{N}{2}-1} \frac{1}{\sigma^2}(|y_n|^2 + |h_n|^2) +$$  Equation (19-1)

$$\frac{N}{2}\ln \pi\sigma^2 = \sum_{i=0}^{M_A-1} \ln\left[\exp\left(\sum_{n=M_Ci}^{M_{Ci}+M_C-1} \frac{|h_n|^2}{\sigma^2} + \ln P_B\right) + \exp(G_i + \ln P_Q)\right]$$

$$\approx \sum_{i=0}^{M_A-1} \max\left\{\sum_{n=M_Ci}^{M_{Ci}+M_C-1} \frac{|h_n|^2}{\sigma^2} + \ln P_B, G_i + \ln P_Q\right\}.$$  Equation (19-2).

The notation $G_i$ can be defined as:

$$G_i \triangleq A_i + \sum_{n=M_Ci}^{M_{Ci}+M_C-1} \frac{1}{\sigma^2}(|y_n|^2 + |h_n|^2) =$$  Equation (20).

$$\sum_{n=M_Ci}^{M_{Ci}+M_C-1} \ln \sum_{s \in C} \frac{1}{4}\exp\left(\frac{2}{\sigma^2}\mathrm{Re}(h_n^* y_n s^*)\right).$$

The null-probability module 442 can further approximate $G_i$ as:

$$\hat{G}_i \triangleq \hat{A}_i + \sum_{n=M_Ci}^{M_{Ci}+M_C-1} \frac{1}{\sigma^2}(|y_n|^2 + |h_n|^2) =$$  Equation (21).

$$\sum_{n=M_Ci}^{M_{Ci}+M_C-1} \frac{2}{\sigma^2}\mathrm{Re}(h_n^* y_n s_{min}^*) -$$

$$2M_C \ln 2 + \sum_{n=M_Ci}^{M_{Ci}+M_C-1} B\left(C, \frac{\sigma}{|h_n|}\right).$$

The null-probability module 442 can calculate the correlation between $h_n^* y_n / \sigma^2$ and either all possible QPSK constellation points represented by s or the closest QPSK constellation point represented by $s_{min}$. The null-probability module 442 can implement Equation (21) using sign flipping operations for computing correlation with QPSK constellation points.

The null-probability module 442 can accurately calculate the null likelihood 432 using Equation (19-1) and Equation (20). Further, the null-probability module 442 can approximately calculate the null likelihood 432 as in Equation (19-2) and Equation (21) with slicing, sign flipping, additions, or a combination thereof. For example, in Equation (21), $s_{min}$ can be obtained from slicing of $h_n^* y_n$, $h_n^* y_n$ is the input of the Viterbi decoder which can be stored and does not require additional computation, and their product $h_n^* y_n s_{min}^*$ can be implemented by sign flipping.

Moreover, $\Sigma_{n=M_Ci}^{M_{Ci}+M_C-1} \mathrm{Re}(h_n^* y_n s_{min}^*)$ represent the real part of the average correlation between $h_n^* y_n$ and $s_{min}$. For Equation (19-2), max{ } can be implemented by a simple comparator. The null-probability module 442 can calculate the null likelihood 432 approximately without using additional complicated operations including multiplication, division, transformation, derivative, integral, or a combination thereof except the square operation for $$\sum_{n=M_Ci}^{M_{Ci}+M_C-1} \frac{|h_n|^2}{\sigma^2}$$

in Equation (16-1) and Equation (16-2).

The null-probability module 442 can calculate the null likelihood 432 based on the content error 206 indicating that the decoded-result 424 satisfied the validity check. The null-probability module 442 can be required to determine the null likelihood 432 only if the control flow passes from the error-check module 408 to the probability-computation module 410 and not to the selection module 404. The null-probability module 442 can also be required to check for the content error 206 and determine the null likelihood 432 if the value of the content error 206 indicates that the decoded-result 424 satisfied the validity check.

It has been discovered that the calculation of null likelihood 432 based on the content error 206 can provide increased accuracy and robustness for the communication system 100. The null likelihood 432 based on the content error 206 can provide increased accuracy and robustness by identifying and not processing cases where the decoding results do not pass an error check.

The null likelihood 432 can be associated with the probability of the reduced false alarm due to pruning based on the evaluation rule 436 on top of existing instance of the false alarm 212. The null likelihood 432 can be used to quantify the likelihood that the decoding parameter 204 is not appropriate but will be determined as being acceptable for decoding and further processing the arriving communication 118 by the communication system 100. The probability of the pruning-false-alarm 212 can be expressed as:

$$P_{FA} \triangleq \int_{\vec{y} \in R_{PDCCH}} p(\vec{y} \mid H_{Null}) d\vec{y}.$$  Equation (22)

For Equation (22), $R_{PDCCH}$ represents the region of pruning where $\vec{y}$ is dismissed by the evaluation module 414. The probability of the reduced false alarm can be an integral of Equation (10) assuming that $\vec{y}$ comes from blank or random QPSK signal related to the null hypothesis.

It has been discovered that the null likelihood 432 provides improved accuracy for the communication system 100. The null likelihood 432 provides improved accuracy by providing an additional measurable and testable characterization for the decoding process beyond the content error 206.

It has also been discovered that the null likelihood 432 calculated with slicing, sign flipping, correlation computation, and additions provides improved efficiency and robustness for the communication system 100. The null likelihood 432 provides improved accuracy and robustness by having a probability basis requiring only simple calculations instead of a correlation basis with more complex operations as described above.

The weight-calculation module 444 is for determining a method to evaluate a combination of the alternative hypothesis 426 and the null hypothesis 428. The weight-calculation module 444 can determine the method of evaluating the hypotheses by generating a decision weight 434.

The decision weight 434 is a factor representing a relative relationship between the alternative hypothesis 426 and the null hypothesis 428. The decision weight 434 can represent the relative importance, likelihood, comparison, or a combination thereof between the alternative hypothesis 426 and the null hypothesis 428.

The weight-calculation module 444 can generate the decision weight 434 corresponding to the decoding likelihood 430, the null likelihood 432, or a combination thereof for representing the relative relationship between the alternative hypothesis 426 and the null hypothesis 428. For example, the decision weight 434 can have $w_0$ corresponding to the null hypothesis 428 or the null likelihood 432, $w_1$ corresponding to the alternative hypothesis 426 or the decoding likelihood, or a combination thereof.

Continuing with the example, the decision weight 434 can be generated such that $w_0$ is the number of blind decoding per block of information received through the control-channel 114 that can yield the false alarm 212. Further $w_1$ can be the number of blind coding per block of information received through the control-channel 114 that can yield the pruning-miss 214. As a more specific example, w0 can be 43 and w1 can be 1 when it is most likely that there exists one valid instance of the decoding parameter 204 among 44 instances of the parameter set 420 corresponding to 44 possible blind decoding attempts.

It has been discovered that the decision weight 434 provides improved accuracy and robustness for the communication system 100. The decision weight 434 provides the improved accuracy by providing a way to simultaneously process the decoding likelihood 430 and the null likelihood 432 for evaluating the decoding process. The improved accuracy through joint assessment of the hypotheses with the decision weight 434 for the likelihoods increases the robustness of the communication system 100 by reducing erroneous decoding process, which can lead to dropped calls, stalled downloads, reduction of download speeds, or a combination thereof.

The probability-computation module 410, including the decoding-probability module 440, the null-probability module 442, and the weight-calculation module 444 can use the first control unit 312, the second control unit 334, the first communication unit 316, the second communication unit 336, or a combination thereof to calculate or generate the decoding likelihood 430, the null likelihood 432, the decision weight 434, or a combination hereof. The probability-computation module 410 can store the various results in the first storage unit 314, the second storage unit 346, the first communication unit 316, the second communication unit 336, or a combination thereof.

After calculating or generating the various results in the probability-computation module 410, the control flow can pass from the probability-computation module 410 to the reliability calculation module 412 using the decoding likelihood 430, the null likelihood 432, the decision weight 434, a status indicator, or a combination thereof as described above between the detection module 402 and the selection module 404. The reliability calculation module 412 is for determining the likely success of the decoding process.

The reliability calculation module 412 can assess the likely success of the decoding by combining likelihoods associated with the null hypothesis 428 and the alternative hypothesis 426. The reliability calculation module 412 can assess the likely success by calculating the decoding reliability 208.

The decoding reliability 208 is an overall assessment of the decoding process. The decoding reliability 208 can be a number, such as a score or a percentage, representing a likelihood of accuracy of the decoding parameter 204, the decoded-result 424, or a combination thereof.

The reliability calculation module 412 can calculate the decoding reliability 208 using the decision weight 434, the decoding likelihood 430, the null likelihood 432, or a combination thereof. The reliability calculation module 412 can calculate the decoding reliability 208 as:

$$\ln p(\vec{y}|H_{PDCCH}) - \ln p(\vec{y}|H_{Null}) - \ln w_1/w_0. \qquad \text{Equation (23)}.$$

The decoding likelihood 430 can be related to ln $p(\vec{y}|H_{PDCCH})$ as described above and defined in Equation (7). The null likelihood 432 can be related to ln $p(\vec{y}|H_{Null})$ as described above and defined in Equation (11). The decision weight 434 can be 'ln $w_1/w_0$'

The reliability calculation module 412 can use the first control unit 312, the second control unit 334, the first communication unit 316, the second communication unit 336, or a combination thereof to calculate the decoding reliability 208. The reliability calculation module 412 can store the decoding reliability 208 in the first storage unit 314, the second storage unit 346, the first communication unit 316, the second communication unit 336, or a combination thereof.

It has been discovered that the decoding reliability 208 calculated using the decision weight 434, the decoding likelihood 430, and the null likelihood 432 provides increased reliability for the decoding process. The decoding reliability 208 provides increased reliability by enabling a joint assessment of the decoding process with evaluations of both the null hypothesis 428 and the alternative hypothesis 426.

After calculating the decoding reliability 208, the control flow can pass from the decoding reliability 208 to the evaluation module 414 using decoding reliability 208, a status indicator, or a combination thereof as described above between the detection module 402 and the selection module 404. The evaluation module 414 is for evaluating the overall decoding process.

The evaluation module 414 can evaluate the overall decoding process by evaluating the decoding parameter 204, the decoded-result 424, or a combination thereof. The evaluation module 414 can evaluate the decoding process in various ways.

For example, the evaluation module 414 can evaluate the decoding process by comparing the decoding reliability 208 to a threshold. The evaluation module 414 can determine the decoding parameter 204, the decoded-result 424, or a combination thereof as appropriate or correct when the decoding reliability 208 is above the threshold.

Also for example, the evaluation module 414 can store the decoding parameter 204, the decoded-result 424, the decoding reliability 208 or a combination thereof corresponding to the internal index 422. The evaluation module 414 can increment the internal index 422 and pass the control flow to the selection module 404.

Continuing with the example, the communication system 100 can repeat the above described processes with a new instance of the decoding parameter 204 according to the internal index 422. The evaluation module 414 can prompt the decoding module 406 to decode the arriving communication 118 with the decoding parameter 204 based on the decoding reliability 208 with the incrementing of the internal index 422 and looping when the decoding reliability 208 is above the threshold.

Continuing with the example, the evaluation module 414 can store the various instances of the decoding parameter 204, the decoded-result 424, the decoding reliability 208 or a combination thereof. The evaluation module 414 can evaluate the decoding process by selecting the decoding parameter 204, the decoded-result 424, or a combination thereof having the highest value of the decoding reliability 208, above the threshold, or a combination thereof.

For further example, the evaluation module 414 can evaluate the decoding process using a maximum a posteriori probability (MAP) decision rule, Bayes decision theory, or a combination thereof. The evaluation module 414 can have an evaluation rule 436 for implementing MAP, Bayes decision, or a combination thereof. The evaluation rule 436 is a threshold condition used for evaluating the decoding process.

Using the decoding reliability 208 calculated in the reliability calculation module 412, the evaluation rule 436 can be:

$$\ln p(\vec{y}|H_{PDCCH}) - \ln p(\vec{y}|H_{Null}) - \ln w_1/w_0 \gtrless_{H_{Null}}^{H_{PDCCH}} 0. \quad \text{Equation (24)}.$$

The Bayes decision in Equation (24) can minimize '$w_0 P_{FA} + w_1 P_{MS}$'. The decoding likelihood 430 can be related to $P_{MS}$ as described above and defined in Equation (9). The null likelihood 432 can be related to $P_{FA}$ as described above and defined in Equation (22). The decision weight 434 can be $w_0$ and $w_1$.

Continuing with the example, the evaluation module 414 can evaluate the decoding process as satisfactory when the left side of Equation (24) is greater than 0. The left side of Equation (21) can correspond to the decoding reliability 208 calculated by the reliability calculation module 412.

Continuing with the example, the evaluation module 414 can use a combination of log-likelihood values for the decision weight 434, the null likelihood 432, and the decoding likelihood 430 to evaluate the decoding process. Based on Equations (1)-(8), the first term of Equation (24) can be the decoding likelihood 430. The first term of Equation (24) can be expressed as:

$$(K-L)\ln 2 + \sum_{n=0}^{\frac{N}{2}-1} \frac{2}{\sigma^2} \text{Re}(h_n^* y_n \hat{x}_{1,n}^*). \quad \text{Equation (25)}.$$

For Equation (25), the summation term can be the decoding likelihood 430 as expressed in Equation (8).

Continuing with the example, Based on Equations (10)-(22), the second term of Equation (21) can be the null likelihood 432. The second term of Equation (24) can be expressed as:

$$\sum_{i=0}^{M_A-1} \max\left\{\sum_{n=M_{Ci}}^{M_{Ci}+M_C-1} \frac{|h_n|^2}{\sigma^2} + \ln P_B, G_i + \ln P_Q\right\}. \quad \text{Equation (26)}.$$

For Equation (26), the summation term can be the null likelihood 432 as expressed in Equation (19).

Continuing with the example, the second term of Equation (24) can be the log-ratio of decision weights 434 where $w_i$ can be the can be the decision weight 434 corresponding to the alternative hypothesis 426 or the decoding likelihood 430 and $w_0$ can be the decision weight 434 corresponding to the null hypothesis 428 or the null likelihood 432.

Continuing with the example, the evaluation module 414 can store the decoding likelihood 430, the null likelihood 432, the decoding reliability, the decoding parameter 204, the internal index 422, the decoded-result 424, or a combination thereof. The evaluation module 414 can further increment the internal index 422 and pass the control flow to the selection module 404 to decode and process the arriving communication 118 based on a different instance of the decoding parameter 204 as described above.

Continuing with the example, the evaluation module 414 can select the decoding parameter 204, the decoded-result 424, or a combination thereof having the largest instance of the decoding reliability 208 by the reliability calculation module 412. The evaluation module 414 can select the decoding parameter 204, the decoded-result 424, or a combination thereof corresponding to the internal index 422 having the largest value of the left side of Equation (21).

Continuing with the example, the evaluation module 414 can further store the decoding parameter 204, the decoded-result 424, or a combination thereof when the left side of Equation (21) for the current instance is larger than the previous instance. The evaluation module 414 can further use a combination of example processes described above to evaluate the decoding process and select the decoding parameter 204, the decoded-result 424, or a combination thereof.

The evaluation module 414 can process the arriving communication 118 with the decoding parameter 204 when a portion of the decoding reliability 208 associated with the decoding likelihood 430 is greater than a different portion of the decoding reliability 208 associated with the null likelihood 432. The evaluation module 414 can use the selected instances of the decoding parameter 204, the decoded-result 424, or a combination thereof based on the evaluation to process, including the left side comparison for the evaluation rule 436.

The evaluation module 414 can process the arriving communication 118 by validating and determining the control information 112 within the selected instance of the decoded-result 424. The evaluation module 414 can determine the control information 112 by evaluating and selecting the correct instance of the decoded-result 424 having the control information 112 therein.

The evaluation module 414 can process the arriving communication 118 by decoding the rest of the arriving communication 118, such as the portion received over the data-channel 116 of FIG. 1. The evaluation module 414 can decode the rest of the arriving communication 118 using the selected instance of the decoding parameter 204, the decoded-result 424, the control information 112 therein, or a combination thereof.

The evaluation module 414 can further process the arriving communication 118 by using the decoded results from the arriving communication 118 according to its intended purpose. For example, the evaluation module 414 can process the arriving communication 118 by completing the communication, such as by displaying the actual message 110, by audibly reproducing the actual message 110, or a combination thereof from the arriving communication 118. Also for example, the evaluation module 414 by installing a program or storing the actual message 110 from the arriving communication 118 to complete the communication with the mobile device 102 of FIG. 1.

As an overall example, the evaluation module 414 can prune the arriving communication 118 during the decoding process. The evaluation module 414 can use the decoding reliability 208, the evaluation rule 436, or a combination thereof to retain or discard the decoding-result 424 after processing with the error-check module 408. The evaluation module 414 can discard the decoding-result 424 even if the content error 206 is not determined according to the decoding reliability 208 and the evaluation rule 436.

The evaluation module 414 can use the first communication unit 316, the first control unit 312, the second communication unit 336, the second control unit 334, or a combination thereof to evaluate the decoding process. The evaluation module 414 can further use the first user interface 318 of FIG. 3, the second user interface 338 of FIG. 3, or a combination thereof to complete the communication, such as by displaying or audibly recreating the actual message 110.

It has been discovered that the evaluation rule 436 incorporating the decision weight 434, the null likelihood 432 based on the null hypothesis 428, and the decoding likelihood 430 based on the alternative hypothesis 426 provide reduced occurrences of the pruning-false-alarm 212 without significantly increasing occurrences of the pruning-miss 214. The evaluation rule 436 incorporating the likelihoods provide the reduction by allowing the null hypothesis 428 and the alternative hypothesis 426 to be tested and optimized using MAP and Bayes optimization processes.

It has been further discovered that determination and use of both the alternative hypothesis 426 and the null hypothesis 428 for communication provides increased accuracy and robustness for the communication system 100. The determination and use of both hypotheses provide increased accuracy by providing added level of evaluation and validation for the decoding process.

It has also been discovered that pruning with the evaluation rule 436 and the decoding reliability 208 resulting from the decoding likelihood 430, the null likelihood 432, and the decision weight 434, provides increased signal processing accuracy. The pruning process can utilize statistical basis, which is separate from basis of processes for the error-check module 408. The pruning process utilizing the evaluation rule 436 and the decoding reliability 208 can prune the false alarm resulting from the error-check module 408.

The communication system 100 has been described with module functions or order as an example. The display system 100 can partition the modules differently or order the modules differently. For example, the functions of the selection module 404 and the decoding module 406 can be combined or the functions of the probability-computation module 410, the reliability calculation module 412, and the evaluation module 414 can be combined. Also for example, the selection module 404 can be before the detection module 402.

The modules described in this application can be hardware implementation or hardware accelerators in the first control unit 316 of FIG. 3 or in the second control unit 338 of FIG. 3. The modules can also be hardware implementation or hardware accelerators within the mobile device 102 or the base station 106 but outside of the first control unit 316 or the second control unit 338, respectively.

The physical transformation from the decoding reliability 208 results in the movement in the physical world, such as the decoding parameter 204 or the decoded-result 424, for the arriving communication 114 for communicating accurately the actual message 110, such that the user of the mobile device 102 can interact appropriately, including driving to the correct location with navigation guidance as the actual message 110. As the user and the mobile device 102 moves, the corresponding changes in the physical world, including changes to the channel 108, results in changes to the decoding reliability 208.

Figure 5:
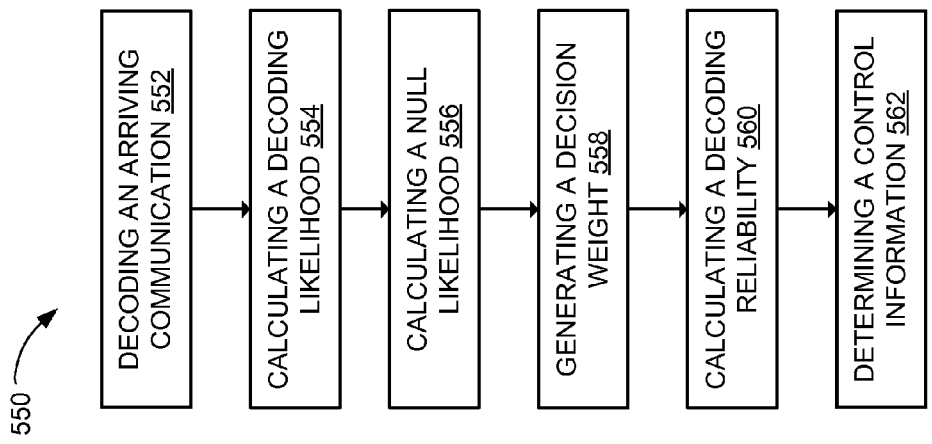
FIG. 5 is a flow chart of a method of operation of a communication system in a further embodiment of the present invention.
Figure 5:
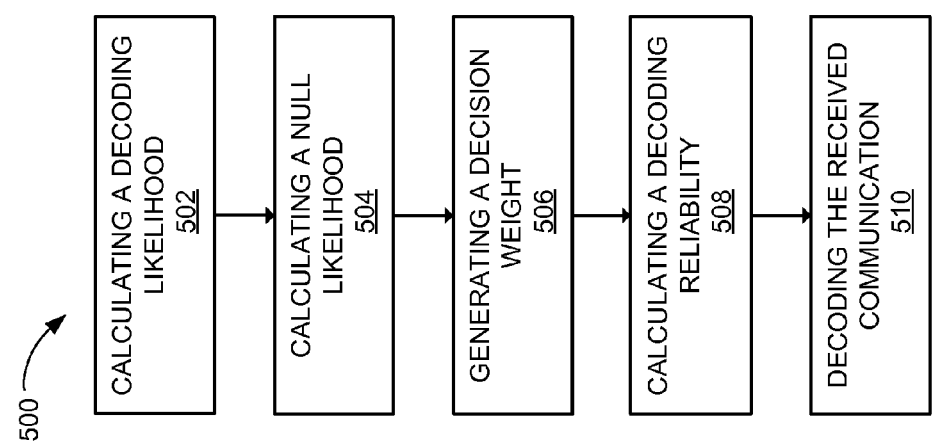

Referring now to FIG. 5, therein is shown a flow chart of a method 500 and a method 550 of operation of a communication system 100 of FIG. 1 in a further embodiment of the present invention. The method 500 includes: calculating a decoding likelihood for characterizing an alternative hypothesis regarding an arriving communication in a block 502; calculating a null likelihood for characterizing a null hypothesis regarding the arriving communication in a block 504; generating a decision weight corresponding to the decoding likelihood, the null likelihood, or a combination thereof in a block 506; calculating a decoding reliability with the decision weight, the decoding likelihood, and the null likelihood in a block 508; and decoding the arriving communication with a decoding parameter based on the decoding reliability for communicating with a device in a block 510.

The method 550 includes: decoding an arriving communication, with a control unit, with a decoding parameter in a block 552; calculating a decoding likelihood for characterizing an alternative hypothesis for evaluating the arriving communication and the decoding parameter in a block 554; calculating a null likelihood for characterizing a null hypothesis for evaluating the arriving communication and the decoding parameter in a block 556; generating a decision weight corresponding to the decoding likelihood, the null likelihood, or a combination thereof in a block 558; calculating a decoding reliability with the decision weight, the decoding likelihood, and the null likelihood, the decoding reliability corresponding to a decoded-result in a block 560; and determining a control information from the decoded-result based on the decoding reliability for displaying on a device in a block 562.

It has been discovered that the calculation of the decoding likelihood 430 of FIG. 4 based on the content error 206 of FIG. 2 can provide increased accuracy and robustness for the communication system 100. The decoding likelihood 430 based on the content error 206 can provide increased accuracy and robustness by identifying and not processing cases where the decoding results do not pass an error check.

It has also been discovered that the decoding likelihood 430 provides improved accuracy for the communication system 100. The decoding likelihood 430 provides improved accuracy by providing an additional measure of accuracy for the decoding process beyond the content error 206. The added level of independent evaluation for the decoding process improves the overall accuracy for the processed signals.

It has further been discovered that the decoding reliability 208 of FIG. 2 calculated using the decision weight 434 of FIG. 4, the decoding likelihood 430 of FIG. 4, and the null likelihood 432 of FIG. 4 provides increased reliability for the decoding process. The decoding reliability 208 provides increased reliability by enabling a joint assessment of the decoding process with evaluations of both the null hypothesis 428 of FIG. 4 and the alternative hypothesis 426 of FIG. 4. Also, the pruning process can utilize statistical basis, which is separate from basis of processes for the error-check module 408 of FIG. 4. The pruning process utilizing the evaluation rule 436 and the decoding reliability 208 can prune the false alarm resulting from the error-check module 408.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of the embodiment of the present invention is that it valuably supports and services the historical trend of reducing costs, simplifying systems, and increasing performance.

These and other valuable aspects of the embodiment of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A communication system comprising:
   a decoding-probability module configured to calculate a decoding likelihood with a control unit for characterizing an alternative hypothesis regarding an arriving communication;
   a null-probability module, coupled to the decoding-probability module, configured to calculate a null likelihood for characterizing a null hypothesis regarding the arriving communication;
   a weight-calculation module, coupled to the decoding-probability module, configured to generate a decision weight corresponding to the decoding likelihood, the null likelihood, or a combination thereof;
   a reliability calculation module, coupled to the decoding-probability module, configured to calculate a decoding reliability with the decision weight, the decoding likelihood, and the null likelihood, the decoding reliability corresponding to a decoded-result; and
   a decoding module, coupled to the reliability calculation module, configured to decode the arriving communication with a decoding parameter based on the decoding reliability for communicating with a device.

2. The system as claimed in claim 1 further comprising an evaluation module, coupled to the reliability calculation module, configured to process the arriving communication with the decoding parameter when a portion of the decoding reliability associated with the decoding likelihood is greater than a different portion of the decoding reliability associated with the null likelihood.

3. The system as claimed in claim 1 further comprising an evaluation module, coupled to the reliability calculation module, configured to determine control information from decoding the arriving communication based on the decoding reliability for communicating with the device.

4. The system as claimed in claim 1 wherein:
   the decoding-probability module is configured to calculate the decoding likelihood using approximations with slicing and addition; and
   the null-probability module is configured to calculate the null likelihood using approximations with slicing and addition.

5. The system as claimed in claim 1 wherein:
   the decoding-probability module is configured to calculate the decoding likelihood based on a pruning-false-alarm, a pruning-miss, or a combination thereof; and
   the null-probability module is configured to calculate the null likelihood based on the pruning-false-alarm, the pruning-miss, or a combination thereof.

6. The system as claimed in claim 1 wherein:
   the decoding-probability module is configured to calculate the decoding likelihood for characterizing the alternative hypothesis for evaluating the arriving communication and the decoding parameter;
   the null-probability module is configured to calculate the null likelihood for characterizing the null hypothesis for evaluating the arriving communication and the decoding parameter;
   the reliability calculation module is configured to calculate the decoding reliability corresponding to the decoded-result;
   further comprising:
   an evaluation module, coupled to the reliability calculation module, configured to determine a control information from the decoded-result based on the decoding reliability for displaying on the device.

7. The system as claimed in claim 6 wherein the evaluation module is configured to decode the arriving communication based on a different instance of the decoding parameter when the decoding likelihood portion of the decoding reliability is less than or equal to the null likelihood portion of the decoding reliability.

8. The system as claimed in claim 6 further comprising:
   an error-check module, coupled to the decoding-probability module, configured to determine a content error based on decoding the arriving communication with the decoding parameter; and
   wherein:
   the decoding-probability module is configured to calculate the decoding likelihood includes calculating the decoding likelihood based on the content error.

9. The system as claimed in claim 6 wherein:
   the decoding-probability module is configured to calculate the decoding likelihood without multiplications or any derivative operations thereof; and
   the null-probability module is configured to calculate the null likelihood without multiplications or any derivative operations thereof.

10. The system as claimed in claim 6 wherein the evaluation module is configured to prune the decoding-result based on the decoding reliability regardless of the content error.

11. A method of operation of a communication system comprising:
    calculating a decoding likelihood with a control unit for characterizing an alternative hypothesis regarding an arriving communication;
    calculating a null likelihood for characterizing a null hypothesis regarding the arriving communication;
    generating a decision weight corresponding to the decoding likelihood, the null likelihood, or a combination thereof;
    calculating a decoding reliability with the decision weight, the decoding likelihood, and the null likelihood; and
    decoding the arriving communication with a decoding parameter based on the decoding reliability for communicating with a device.

12. The method as claimed in claim 11 wherein decoding the arriving communication includes processing the arriving communication with the decoding parameter when a portion of the decoding reliability associated with the decoding likelihood is greater than a different portion of the decoding reliability associated with the null likelihood.

13. The method as claimed in claim 11 wherein decoding the arriving communication includes determining control information from decoding the arriving communication based on the decoding reliability for communicating with the device.

14. The method as claimed in claim 11 wherein calculating the decoding likelihood and the null likelihood includes calculating the decoding likelihood and the null likelihood using approximations with slicing and addition.

15. The method as claimed in claim 11 wherein:
    calculating the decoding likelihood includes calculating the decoding likelihood based on a pruning-false-alarm, a pruning-miss, or a combination thereof; and
    calculating the null likelihood includes calculating the null likelihood based on the pruning-false-alarm, the pruning-miss, or a combination thereof.

16. A method of operation of a communication system comprising:

decoding an arriving communication, with a control unit, with a decoding parameter;

calculating a decoding likelihood for characterizing an alternative hypothesis for evaluating the arriving communication and the decoding parameter;

calculating a null likelihood for characterizing a null hypothesis for evaluating the arriving communication and the decoding parameter;

generating a decision weight corresponding to the decoding likelihood, the null likelihood, or a combination thereof;

calculating a decoding reliability with the decision weight, the decoding likelihood, and the null likelihood, the decoding reliability corresponding to a decoded-result; and determining a control information from the decoded-result based on the decoding reliability for displaying on a device.

17. The method as claimed in claim 16 wherein determining control information includes decoding the arriving communication based on a different instance of the decoding parameter when the decoding likelihood portion of the decoding reliability is less than or equal to the null likelihood portion of the decoding reliability.

18. The method as claimed in claim 16 further comprising:
   determining a content error based on decoding the arriving communication with the decoding parameter; and
wherein:
   calculating the decoding likelihood includes calculating the decoding likelihood based on the content error.

19. The method as claimed in claim 16 wherein calculating the decoding likelihood and the null likelihood includes calculating the decoding likelihood and the null likelihood without multiplications or any derivative operations thereof.

20. The method as claimed in claim 16 wherein calculating the decoding reliability includes pruning the decoding-result based on the decoding reliability regardless of the content error.

* * * * *